United States Patent [19]

Watson

[11] Patent Number: 4,511,848
[45] Date of Patent: Apr. 16, 1985

[54] SYNCHRONOUS AM DEMODULATOR WITH QUADRATURE SIGNAL CANCELLATION

[75] Inventor: William S. Watson, Eau Claire, Wis.

[73] Assignee: Watson Industries, Inc., Eau Claire, Wis.

[21] Appl. No.: 504,585

[22] Filed: Jun. 15, 1983

[51] Int. Cl.³ .............................................. H03D 1/04
[52] U.S. Cl. ..................................... 329/50; 329/166; 329/168
[58] Field of Search ................. 329/50, 145, 166, 168, 329/169

[56] References Cited

U.S. PATENT DOCUMENTS 3,403,345 9/1968 Frank et al. ...................... 329/50 X
3,631,355 12/1971 Vail ....................................... 329/50

Primary Examiner—Siegfried H. Grimm
Attorney, Agent, or Firm—Merchant, Gould, Smith, Edell, Welter & Schmidt

[57] ABSTRACT

A method and apparatus for removing quadrature error signal components from synchronous AM demodulation signals are disclosed. A synchronous AM demodulator processes a synchronous sensor output signal in phase relation to a phase reference signal. Means are provided for dynamically producing a counteracting signal that is stably phase related to the system reference signal. The counteracting signal is in phase with the quadrature component of the synchronous signal such that when added to the synchronous signal, the quadrature component thereof is minimized or eliminated.

15 Claims, 2 Drawing Figures

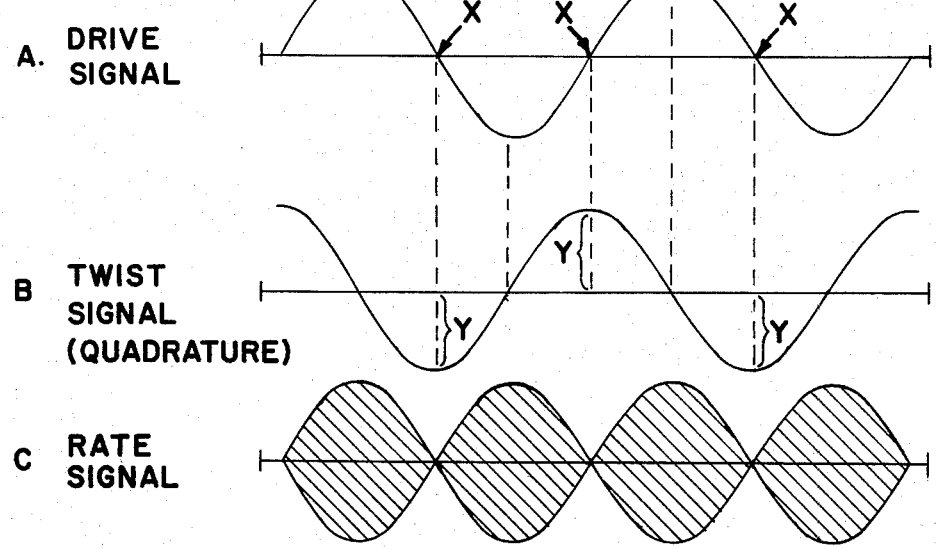
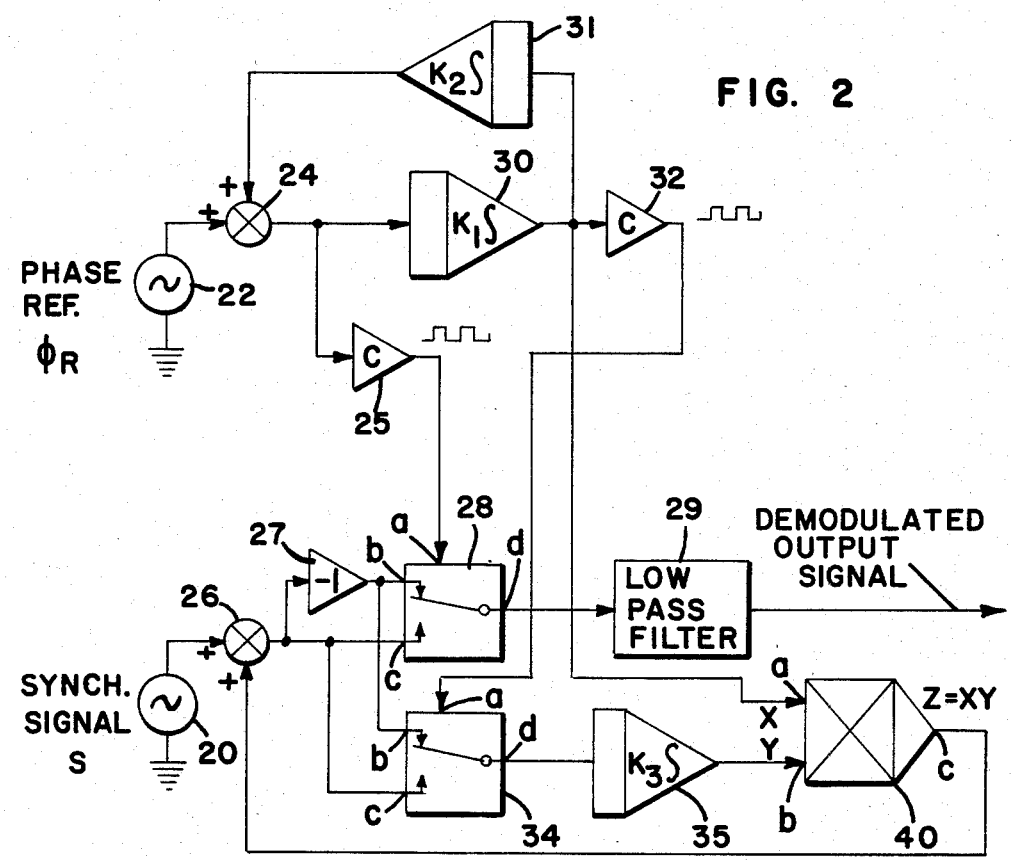

SYNCHRONOUS AM DEMODULATOR WITH QUADRATURE SIGNAL CANCELLATION

TECHNICAL FIELD

This invention relates generally to the field of synchronous AM demodulation, and more particularly to an improved synchronous AM demodulation circuit which includes quadrature correction and which is particularly useful for demodulating angular rate sensor signals.

BACKGROUND OF THE INVENTION

Synchronous AM demodulator circuits are well-known in the art. Such circuits have been used for numerous applications and are known by many names including: phase-sensitive demodulators, suppressed-carrier AM demodulators, synchronous-switching demodulators, phase-sensitive detectors, lock-in amplifiers and simply synchronous detectors. The circuit is often also referred to as a synchronized full-wave rectifier. If the input signal is exactly in phase with the carrier signal, the output signal of the demodulator will appear as a full-wave rectified waveform. The principles of operation of synchronous AM demodulators in general, are well-known in the art, and will not be detailed herein.

Synchronous demodulators are often used in low noise systems because of their inherent noise reducing characteristics. One application in which the synchronous AM demodulator is particularly useful is in the instrumentation sensor art, and in particular for demodulating the sensed output signals from constrained actuator masses. Such vibrating masses may take a number of different configurations such as reed members, piezoelectric crystals, or electromagnetic members. In such vibratory mass instrumentation sensor art, an actuator mass is vibrated or maintained in oscillation in a straight line along which it is guided by a constraint. The oscillating mass does not apply any force other than its own weight in a direction transverse to the guide as long as the guide maintains a constant orientation in space. When the guide is forced to rotate about an axis at right angles to itself, the oscillating member feels the forces applied to it through the guide member and responds to such applied forces by generating a signal or a change in vibratory motion that can be detected by a sensing circuit, often in the form of a synchronous AM demodulator. When a vibratory mass such as a piezoelectric crystal is used, the crystal responds to applied forces by generating alternating or pulsating signals proportional to the applied force. When an electromagnetic vibratory sensing element is used, the sensor responds to the applied force by causing a detectable change in the characteristics of the sensed electromagnetic field. Similarly, if a capacitive sensing system is used, the vibrating element responds to the applied force by causing a disturbance or a detectable change in the sensed capacitive environment. While a detailed discussion of the vibratory element sensor art will not be pursued herein, a more in-depth discussion of such art can be found in my copending U.S. patent application Ser. No. 341,229 entitled Angular Rate Sensor Apparatus, filed on Jan. 21, 1982. To the extent that the disclosures of my copending application are revelant to an understanding of the present invention, they are incorporated herein by reference.

Most angular rate sensor art of today, which has synchro operated controls and communications uses a synchronous AM demodulator to detect phase related amplitude signals. Design problems related to errors involved with such demodulation generally result from: (1) sampling phase error; and (2) the existence of an undesirable (quadrature component) in the signal being demodulated. In some, fairly unsophisticated, sensor design applications the phase error level is relatively small and can be adequately designed around by improving the phase stability of the demodulator, for example, by designing the demodulator circuits with high slew rates. In such applications, the quadrature component error issue is not even addressed. However, in more sophisticated angular rate sensor art involving demodulation of signals from state-of-the-art piezoelectric sensor elements, the quadrature signal component can contribute significantly to the system error. For example, it has been found that the amount of quadrature signal involved in a vibrating element angular rate sensor signal of a piezoelectric element sensor is typically equivalent to 600 degress per second, and in some cases has been found to be as high as 35,000 degrees per second. Such large quadrature signal error components must be corrected in order to allow for suitable operation of the demodulator.

Other than attempting to filter out the quadrature signal component, the prior art has generally not effectively dealt with minimizing or eliminating the quadrature signal component error. Filtering with fixed resistive and capacitive components is generally ineffective for eliminating the quadrature component error and does not provide for dynamic changes in the error signal in response to temperature or other system parameter changes. Further, such filtering also directly affects the primary signals being demodulated as well as the error contributing portion of the signal. Similarly, switching techniques that have been employed to increase the slew rate of the demodulator by sample switching, have not effectively dealt with phase jitter errors, the magnitude of which also relate back to the quadrature component error signal. Further, since slew rate parameters of an operational amplifier are not stable factors, but change with the amplifier's temperature and age, error reducing designs which concentrate on slew rate considerations do not effectively minimize the dynamic errors involved in the system.

The present invention provides an improved demodulator circuit configuration that uses the predictability of the sensor signals in a sensor demodulator structure, to configure a circuit that effectively removes or minimizes the quadrature component error signal from the demodulator sensed signal. The circuit configuration of the present invention reduces systematic output noise by eliminating transients at the sample switching stage of the demodulator, and which dynamically adjusts to changing environmental and sensor parameter conditions. The circuitry of the present invention does not use filtering techniques which degrade the desired signal output, and provides reduced random output noise by eliminating phase jitter effects of sample switching in the demodulation process. The circuitry of the present invention also enables phase reference signals to be obtained from split phase-lock loop circuitry.

SUMMARY OF THE INVENTION

The present invention provides a highly efficient and dynamically operable synchronous AM demodulator circuit configuration and method which effectively removes the quadrature error signal from the synchronous signal. When applied to the sensor art for demodulating output response signals from vibratory actuator mass elements such as piezoelectric crystals, the accuracy of such devices increases tremendously. In general, the quadrature error signal is removed by the present invention from the synchronous signal by mixing or subtracting a counteracting signal from the synchronous or sensor output signal. The amplitude of the counteracting signal to be mixed with the synchronous signal can be controlled by a feedback control system which dynamically varies and changes the level of the counteracting signal to match existing environmental conditions such a temperature, pressure and the like. The phase of the counteracting signal is contrained and related to the phase reference of the system, in a stable manner, to reduce possible sources of error and to insure that the counteracting signal will be mixed only with the quadrature signal component of the synchronized signal, and not with that primary portion of the synchronous signal that is to be measured at the demodulator output terminal.

Accordingly, the inventive method of removing a quadrature error signal component from a synchronous signal in a synchronous AM demodulator network having a phase reference signal, generally includes the steps of:

(a) generating a counteracting signal that is phase related in a stable manner, to the system phase reference signal; and (b) mixing the counteracting signal with the synchronous signal such that the counteracting signal cancels the quadrature error signal component from the synchronous signal.

According to one technique of practicing the method of this invention, there is included the step of controlling the amplitude of the counteracting signal that is mixed with the synchronous signal, by a closed feedback circuit that dynamically adjusts to changing circuit and environmental parameters.

According to the broad concept of the invention, there is provided in combination with a synchronous AM demodulator circuit of the type suitable for demodulating a synchronous signal having a quadrature component, circuit means operatively connected with the demodulator circuit for dynamically minimizing the quadrature component of the synchronous signal. According to one embodiment of such apparatus there is provided a quadrature corrector demodulator circuit having synchronous AM demodulator circuit means operatively connected to receive a synchronous input signal and a synchronous phase reference input signal, for providing a demodulated output signal responsive thereto, wherein the synchronous signal includes a quadrature signal component. A counteracting signal producing circuit means which is operatively connected to receive the synchronous output signal and the phase reference input signal dynamically generates in reponse to such signals a counteracting signal that is phase related, in stable manner, to the synchronous phase reference signal. A mixing circuit, operatively connected to receive the synchronous input signal and the counteracting signal, sums the signals in a manner such that the counteracting signal subtracts from and cancels out the quadrature signal component of the synchronous signal.

According to one embodiment of the quadrature corrector demodulator circuit as above described, the phase reference signal is integrated to provide a quadrature phase reference signal that is 90 degrees out of phase from the synchronous phase reference signal. There is also provided feedback circuit means operatively connected with such integrator circuit for providing a closed loop bias control for the quadrature phase reference signal. According to a preferred embodiment of the invention, the circuitry for producing the counteracting signal includes a sampling circuit operatively connected to receive the synchronous input signal and the quadrature phase reference signal and to produce therefrom a sampled signal characterized by 180 degree polarized sample segments of the synchronous input signal. An integrated network is provided for averaging and accumulating the sampled signals to produce an output slew rate bias signal that is proportional to the accumulated average signal. Finally, according to the preferred embodiment of the corrector demodulator circuit, there is provided a multiplier circuit that produces the counteracting signal by multipling the slew rate bias signal and the quadrature phase reference signals, which counteracting signal is fed back to the mixing summing circuit to complete a closed-loop feedback system.

The invention also contemplates a vibratory element sensor apparatus in general and in particular, one having a piezoelectric crystal of the type that produces a sensed synchronous output signal in response to an impressed force; drive means for driving the crystal with a phase reference signal; synchronous AM demodulator circuit means operatively connected to receive the sensed synchronous output signal and the phase reference signal for producing a demodulated output signal responsive thereto, wherein the sensed synchronous output signal includes a quadrature signal component; counteracting signal producing circuit means operatively connected to receive the sensed synchronous output signal and the phase reference signal for dynamically generating in response thereto a counteracting signal that is stably phase related to the phase reference signal; and a mixing circuit operative to sum the sensed synchronous output signal with the counteracting signal so as to cancel the quadrature signal component of the sensed synchronous output signal.

It will be noted that while the present invention will be described with respect to its particular applicability to the demodulation of a synchronous signal received from a sense crystal of a piezoelectric crystal sensing structure, that the invention is not limited to this particular application, but applies equally well to any synchronous AM demodulator circuit wherein the quadrature signal component of the signal is to be eliminated or minimized. Further, while particular circuit configurations will be described with respect to illustrating the construction of a preferred circuit embodiment that clearly incorporates the principles of this invention, it will be understood that the invention is not limited to the specifics of the circuitry disclosed. For example, phase reference integrators and comparators as disclosed, could readily be replaced or augmented by phase dividing phase locked loop arrangements. Similarly, the multiplier disclosed in the circuitry could readily be replaced by a gain control circuit such as by an operational amplifier with a field effect transistor for variable gain control. Similarly, while a particular sampling switch circuit configuration and arrangement is illustrated with respect to the preferred embodiment description, it will be understood that variations of such switching arrangement could equally well be used, for example, such as using the switching circuitry to shunt instead of to pass signals. It is also contemplated that the principles of the present invention could be implemented by means of microprocessor control. These and other modifications of the invention will become apparent to those skilled in the art, in light of the following description of a preferred embodiment of this invention.

BRIEF DESCRIPTION OF THE DRAWING

Referring to the Drawing, wherein like numerals represent like parts throughout the several views:

FIG. 1 is a diagrammatic view illustrating the phase relationships of various signals in an angular rate sensor apparatus of the type with which the quadrature corrector demodulator circuit of the present invention is particularly useful and with regard to which the preferred embodiment of the invention will be described; and FIG. 2 is a functional schematic diagram of a quadrature corrector demodulator circuit constructed according to a preferred embodiment of the invention and incorporating the general principles of the invention.

DESCRIPTION OF THE PREFERRED EMBODIMENT

While the present invention is applicable to quadrature correction in synchronous AM demodulators in general, its application has been found to be particularly useful in the angular rate sensor art. In particular, the invention has been found to apply directly to the demodulation of the synchronous signal derived from a sensor element (such as a piezoelectric crystal) in an angular rate sensor instrumentation apparatus. It will be understood, however, that the invention applies more universally to the removal of quadrature error signals from any synchronous signal being demodulated. The following description, however, will specifically refer to the preferred embodiment application of the invention to an angular rate sensor demodulator.

Before proceeding with a detailed description of a circuit implementing the present invention, it will be helpful to review the various signal relationships between signals found in an angular rate sensor synchronous AM demodulator, and how the relationship of such signals can be used to advantage in designing a quadrature correcting demodulator circuit. The signals in an angular rate sensor are highly predictable. FIG. 1 illustrates the phase relationships of typical signals found in an angular rate sensor. The drive signal (i.e. the signal used to activate or energize the vibratory actuator mass of the sensor apparatus) is in phase with the actual resonance motion of the vibrating element, and is illustrated at FIG. 1A. The signal illustrated in FIG. 1B is referred to as a "twist" signal which is a quadrature signal (i.e. 90 degrees out of phase with the drive signal). The twist signal occurs in the sensor structure as a result of physical misalignments of the drive and sense devices of the system. Accordingly, both the amplitude and the phase of the twist signal are referenced directly back to the drive signal. The twist signal is proportional in amplitude and is 90 degrees out of phase with the drive signal. The "rate" signal (i.e. that responsive signal derived from the vibratory sensor element when a force is impressed thereon) is superimposed on the twist signal, and is illustrated in phase relationship with the twist and drive signals at FIG. 1C. As illustrated, the rate signal is always either directly in phase with or is 180 degrees out of phase with the drive signal, depending on the direction of angular rate sensing (i.e. the direction in which the forces are applied to the vibratory sensor element). The amplitude of the rate signal is proportional to the magnitude of the angular rate (i.e. to the magnitude of the impressed forces applied to the vibratory angular rate sensor element).

As will become clearer upon a more detailed description of the invention, the twist or quadrature signal in the angular rate sensor circuitry contributes significant error to the demodulation process, particularly when the twist signal is significantly large. In the synchronous AM demodulation process, "sampling" of the synchronous signal being demodulated occurs at a periodic sample time period, determined by the phase reference, which is that of the drive signal. That instant of time in which the phase reference sample signal crosses the zero axis is generally referred to as the "sample transition", and is denoted at "X" in FIG. 1A. As is illustrated in FIG. 1B, since the twist signal is a quadrature signal in the system, its amplitude at the sample transition point (denoted at "Y") is generally at a maximum. Therefore, when the demodulator circuitry "switches" at the sample transition time, fairly significant signal levels are traded back and forth between sample segments in the demodulation process. The handling of such high-level sample segments creates and amplifies phase jitter errors. It will be appreciated that if the magnitude of the twist (i.e. quadrature) signal were zero at the sample transition periods (i.e. if the "Y" parameter of FIG. 1B were zero), any phase jitter appearing at the sample transition time periods would have negligible error producing effects.

An additional design consideration relating to angular rate sensor demodulation is that a high twist signal requires the processing circuitry to slew at a very fast rate at the sample transition time "X". This constraint is subject to the introduction of further error into the system, since the slew rate parameter of an operational amplifier is not a stable parameter, but changes significantly as the operational amplifier warms up with operative use, as the ambient system temperature changes, and with the age of the operational amplifier. From a design perspective, however, if the magnitude of the twist (quadrature) signal were zero at the sample transition time, then there would be no critical high slew rate design constraints placed upon the demodulator circuitry, since the circuitry would not be required to handle large signals at the sample transition time periods.

The above considerations emphasize the need and use for minimizing or eliminating the quadrature signal in the angular rate sensor demodulator circuitry. The present invention directly addresses this issue. The present invention develops a counteracting signal that is mixed with the synchronous signal from the sensor element, such that the counteracting signal subtracts from and cancels the quadrature component of the sensor signal, but does not affect the primary information-containing portion of the signal. The magnitude of the counteracting signal is dynamically controlled by a feedback network to dynamically change the amplitude of the quadrature correcting signal to conform with environmental changes and other parameter effecting conditions of the real time system. In addition, the counteracting signal is phase related to the primary phase reference signal of the sensor system (i.e. to the drive signal) and is accurately regulated thereby by means of a feedback network, to reduce possible sources of error in phase drift of the counteracting signal.

These goals have been achieved with the present invention by the circuitry diagrammatically and schematically illustrated in FIG. 2. Referring thereto, the synchronous signal source, representing the output signal from the sensor element, is generally designated at 20. The synchronous signal is generally referred to in FIG. 2 as "S". The phase reference signal source for the demodulator circuitry is generally illustrated at 22 in FIG. 2, and the phase reference signal is denoted by the notation "$\phi_R$". As previously described, the phase reference signal has the same phase characteristics as the drive signal for the vibratory sensor element. The general equations for the phase reference and the synchronous sensed signals are as follows:

$$\phi_R = A \sin \omega t - D$$

$$S = B \sin \omega t + C \cos \omega t,$$

wherein "D" represents the DC bias offset of the phase reference signal, and the cosine component of the sensor signal represents the quadrature signal component that is to be eliminated or minimized.

The phase reference signal 22 is applied through a summing junction 24 and a clipping amplifier 25 to a control input terminal 28a of a sample switching network generally designated 28. In the preferred embodiment, the sample switching network 28 comprises a CMOS bilateral digital switch, switchable between first and second states as diagrammatically illustrated by the movable element within the switch block, engaging first and second stationary contacts corresponding to first and second signal input terminals 28b and 28c respectively of the sample switching network. The signal output of the sample switching network 28 is indicated at 28d. The sample switching circuit 28 is operable in response to the control signal received at its control input terminal 28a to switch states every 180 degrees of the phase reference signal (i.e. at each sample transition point "X" in FIG. 1A) of the phase reference signal.

The synchronous sense signal (S) is applied through a summing junction 26 to the second input terminal 28c of the sample switching network 28, and through the summing junction 26 and in inverter 27 to the first signal input terminal 28b of the sampling switching network 28. The signal output 28d of the sample switching network 28 is directly connected to an input terminal of a Low Pass Filter network 29. The signal output from the Low Pass Filter 29 comprises the demodulated signal output of the demodulator circuitry.

The circuit components above-described generally represent the state of the prior art synchronous AM demodulator art, as heretofore applied to demodulation of angular rate sensor signals. The sensor signal (S) containing both primary and quadrature components was rectified by means of the sample switching network in phase relationship with the phase reference signal ($\phi_R$). The rectified signal (still containing both primary and quadrature components) was then filtered by the low pass filter 29 to provide the demodulated output signal.

The remaining circuitry herein described with respect to FIG. 2, generates and dynamically controls the phase and amplitude of a counteracting signal, which when combined with the synchronous sensor signal (S), removes or minimizes the quadrature component thereof.

Referring to FIG. 2, the phase reference signal for detecting the quadrature signal, as hereinafter described in more detail, is provided by a pair of integrators. The phase reference signal $\phi_R$, is applied through the summing junction 24 to a first integrator 30, having an integration constant $K_1$ that is generally equal to $(1/\omega)$. The signal output from integrator 30 represents a quadrature phase reference signal that is 90 degrees out of phase from the synchronous phase reference signal $\phi_R$. The quadrature phase reference signal is integrated by a second integrator 31 having an integration constant (K2) that is much less than $(1/\omega)$. The signal output from integrator 31 is applied in a feedback loop to the summing junction 24. The integrator 31 senses the DC bias level on the quadrature phase reference signal and essentially removes the DC bias offset parameter (D) from the $\phi_R$ signal. The signal output from integrator 30 (i.e. the quadrature phase reference signal) is directly applied to a first signal input terminal 40a of a four quadrant multiplier 40 and is applied by means of a clipping amplifier 32 to a control input terminal 34a of a sample switching network 34.

The four quadrant multiplier 40 further has a second signal input terminal 40b and a signal output terminal 40c. The multiplier operatively multiplies the signals applied to its input terminals 40a and 40b and provides a multiplied output signal at its output terminal 40c, which is directly applied to the summing junction 26.

The sample switching network 34 is in the preferred embodiment, of the same construction as that of the sample switching network 28. The switching network 34 has first and second signal input terminals 34b and 34c respectively and a signal output terminal 34d. The synchronous sensor output signal (S) is applied through the summing junction 26 to the second input terminal 34c of the switching network, and is applied by means of the inverter 27 to the first signal input terminal 34b of the switching network 34. The signal output terminal of the switching network 34 is connected to provide signal flow directly to an integrator 35 having an integration constant (K3) much less than $(1/\omega)$. The signal output from integrator 35 is directly applied to the second input terminal 40b of the multiplier 40.

The quadrature phase reference signal applied to the control input terminal 34a of the switching network 34 operates the switching network 34 as a sampling network which effectively changes the polarity of the incoming signal of the sampling network, in 180 degree samples. The rectified samples (representing the quadrature error signal) are averaged and accumulated by the integrator 35 which produces an output slew rate proportional to the average quadrature error. The integrator will produce a zero slew rate (at a constant bias) only when the quadrature error is zero. The bias signal from the integrator 35 is applied to the multiplier 40 which controls the amplitude of the quadrature counteracting or correction signal. Such counteracting signal is derived from the product of the cosine signal from the quadrature phase reference signal and the bias signal from the integrator 35. The amplitude of such counteracting or correcting cosine signal is proportional to the bias voltage and provides an opposite phase for an opposite bias polarity. The quadrature correction signal thus produced dynamically varies with the actual quadrature error, and subtracts from the quadrature error signal when added in the summing junction 26 to the synchronous signal (S). The corrected signal from the summing junction 26 is then resampled to determine the remaining quadrature error, for subsequent correction through the quadrature correction feedback loop.

As a result of the quadrature signal correction process, the signal passing through the Low Pass Filter 29 and to the demodulated output terminal will be a true synchronous signal having only sine components and virtually no cosine or quadrature error components.

It will be appreciated that while the invention has been described with regard to a particular quadrature corrector demodulator circuit, that other circuit configurations which perform the quadrature correction function could equally well be employed. Similarly, various portions of the circuitry itself could be replaced by comparable functional components. For example, while a pair of integrators (30 and 31) have been illustrated for implementing the quadrature phase reference signal, a simpler phase reference configuration using a phase locked loop could also be used. As previously described, the four quadrant multiplier network could, for example, be replaced by a gain control circuit such as an operational amplifier with a field effect transistor for variable gain control. Similarly, the sample switching configurations could also be modified to, for example, shunt instead of pass signals.

From the foregoing description, it will be appreciated that the present invention solves many of the problems and deficiencies associated with prior art synchronous AM demodulator configurations. It will be understood that while a specific application for the present invention, as used in association with a rate sensor instrumentation apparatus has been disclosed, the invention is also applicable to other synchronous AM demodulation systems. While specific circuit components and arrangements have been disclosed in association with the description of a preferred embodiment of the invention, it will be understood that many other variations of such circuitry are possible within the spirit and broad scope of this invention. Other modifications of the invention will be apparent to those skilled in the art in light of the foregoing description. This description is intended to provide a specific example of an individual embodiment which clearly discloses the present invention. Accordingly, the invention is not limited to the described embodiment, or to the use of specific elements therein. All alternative modifications and variations of the present invention which fall within the spirit and broad scope of the appended claims are covered.

I claim:

1. A method of removing a quadrature error signal component from a synchronous signal in a synchronous AM demodulator network having a phase reference signal, comprising the steps of:
    (a) generating a counteracting signal, phase related in stable manner to the system phase reference signal; and
    (b) mixing said counteracting signal with said synchronous signal, wherein said counteracting signal subtracts from the quadrature error signal component of said synchronous signal.

2. The method of claim 1, including the step of controlling the amplitude of said counteracting signal mixed with said synchronous signal by a closed feedback circuit that dynamically adjusts to changing circuit and environmental parameters.

3. The method as recited in claim 2, wherein said amplitude controlling step further comprises:
    (a) sampling the synchronous signal in 180 degrees sample segments;
    (b) accumulating the average of said samples as a bias voltage in an integrator; wherein the output slew rate of said integrator is proportional to the average sample error; and
    (c) summing said accumulated bias voltage in phase relation to the system phase reference signal, with said synchronous signal, to close the control loop.

4. The method of claim 1, wherein the step of generating the counteracting signal in phase relation to the system phase reference signal comprises the steps of: integrating said system phase reference signal; and dynamically controlling the bias level of said integrated system phase reference signal by a closed feedback loop.

5. In combination with a synchronous AM demodulator circuit of the type suitable for demodulating a synchronous signal having a quadrature component, circuit means operatively connected with said demodulator circuit for dynamically minimizing said quadrature component of said synchronous signal.

6. A quadrature corrector demodulator circuit comprising:
    (a) synchronous AM demodulator circuit means operatively connected to receive a synchronous input signal and a synchronous phase reference input signal, for providing a demodulated output signal responsive thereto; said synchronous signal including a quadrature signal component;
    (b) counteracting signal producing circuit means operatively connected to receive said synchronous input signal and said phase reference input signal for dynamically generating in response thereto a counteracting signal that is stable and phase related to said synchronous phase reference signal; and
    (c) mixing circuit means operatively connected to receive said synchronous input signal and said counteracting signal for summing said signals; wherein said counteracting signal tends to cancel said quadrature signal component of said synchronous signal.

7. A quadrature corrector demodulator circuit as recited in claim 6, wherein said counteracting signal producing circuit means includes integrator circuit means operatively connected for integrating said phase reference input signal to produce a quadrature phase reference signal that is 90 degrees out of phase from the synchronous phase reference signal.

8. A quadrature corrector demodulator circuit as recited in claim 7, wherein said counteracting signal producing circuit means further includes feedback circuit means operatively connected with said integrator circuit means for providing a closed loop bias control for said quadrature phase reference signal.

9. A quadrature corrector demodulator circuit as recited in claim 7, wherein said counteracting signal producing circuit means further includes sampling circuit means operatively connected to receive said synchronous input signal and said quadrature phase reference signal for producing a sampled signal in response to said quadrature phase reference signal, characterized by 180 degree polarized sample segments of said synchronous input signal.

10. A quadrature corrector demodulator circuit as recited in claim 9, wherein said counteracting signal producing circuit means further includes circuit means for averaging and accumulating said sampled signals to produce an output slew rate bias signal proportional to said accumulated average signal.

11. A quadrature corrector demodulator circuit as recited in claim 10, wherein said averaging and said accumulating circuit means comprises an integrator network.

12. A quadrature corrector demodulator circuit as recited in claim 10, wherein said counteracting signal producing circuit means further includes multiplier circuit means operatively connected for receiving and multiplying said slew rate bias signal and said quadrature phase reference signals, to produce said counteracting signal; wherein said sampling circuit means, said averaging and accumulating circuit means, said multiplier circuit means and said mixing circuit means form a closed-loop feedback system.

13. A quadrature corrector demodulator circuit as recited in claim 9, wherein said sampling circuit means comprises a digital bilateral switching circuit.

14. A vibratory element sensor apparatus comprising:
(a) a vibratory element sensor of the type that produces a sensed synchronous output signal in response to an impressed force;
(b) drive means for driving said sensor with a phase reference signal;
(c) synchronous AM demodulator circuit means operatively connected to receive said sensed synchronous output signal and said phase reference signal, for producing a demodulated output signal responsive thereto, said sensed synchronous output signal including a quadrature signal component;
(d) counteracting signal producing circuit means operatively connected to receive said sensed synchronous output signal and said phase reference signal for dynamically generating in response thereto a counteracting signal that is phase related, in stable manner, to said phase reference signal; and
(e) mixing circuit means operatively connected to receive said sensed synchronous output signal and said counteracting signal for summing the two signals; wherein said counteracting signal tends to cancel said quadrature signal component of said sensed synchronous output signal.

15. A vibratory element sensor apparatus as recited in claim 14, wherein said vibratory element sensor comprises a piezoelectric crystal.

* * * * *